United States Patent [19]
Walsh

[11] Patent Number: 5,279,974
[45] Date of Patent: Jan. 18, 1994

[54] PLANAR PV HGCDTE DLHJ FABRICATED BY SELECTIVE CAP LAYER GROWTH

[75] Inventor: Devin T. Walsh, Goleta, Calif.

[73] Assignee: Santa Barbara Research Center, Goleta, Calif.

[21] Appl. No.: 918,957

[22] Filed: Jul. 24, 1992

[51] Int. Cl.$^5$ .......................................... H01L 31/18
[52] U.S. Cl. ........................................ 437/3; 437/78; 437/126; 437/133; 437/904; 257/21; 257/188; 257/200; 257/442
[58] Field of Search ................. 437/5, 77, 78, 90, 126, 437/133, 3, 4, 904, 906; 156/610; 257/21, 188, 189, 200, 442

[56] References Cited

U.S. PATENT DOCUMENTS

| | | | |
|---|---|---|---|
| 3,378,915 | 3/1966 | Zenner | 437/904 |
| 3,558,375 | 9/1968 | Engler | 437/904 |
| 4,105,478 | 8/1978 | Johnson | 148/188 |
| 4,132,999 | 1/1979 | Maille et al. | 257/442 |
| 4,206,003 | 6/1990 | Koehler | 148/1.5 |
| 4,301,463 | 9/1989 | Burrus, Jr. | 257/189 |
| 4,608,586 | 8/1986 | Kim | 257/189 |
| 4,868,622 | 9/1989 | Shigenaka | 257/442 |

OTHER PUBLICATIONS

"Development of HgCdTe LWIR Heterojunction Mosaics", Proc. IRIS Detector, 1986, vol. II, pp. 251-260, by C. C. Wang et al.

Primary Examiner—Olik Chaudhuri
Assistant Examiner—Ramamohan Rao Paladugu
Attorney, Agent, or Firm—W. C. Schubert; W. K. Denson-Low

[57] ABSTRACT

A photodiode (10) fabricated in accordance with the method of the invention includes a substrate (11) and a semiconductor base region (12) overlying the substrate. The base region is comprised of Group IIB-VIA material and has a first type of electrical conductivity. A passivation layer (16) overlies the base region and is also comprised of Group IIB-VIA material. A dielectric layer (18) at least partially overlies the passivation layer. During fabrication the dielectric layer functions as an etch stop during a removal of excess cap material, the remaining cap material forming a cap region (14) within an opening that is etched through the dielectric layer and the passivation layer. The cap region is also comprised of Group IIB-VIA material, has a second type of electrical conductivity, and forms a heterojunction (14a) with the base region. An electrically conductive contact pad (20) and an electrically conductive interconnect, preferably an indium bump (22), are formed upon the cap region. The topside surface of the photodiode is substantially planar, and the indium bump may be made significantly larger than the area of an underlying photodetector unit cell.

12 Claims, 3 Drawing Sheets ns
PLANAR PV HGCDTE DLHJ FABRICATED BY SELECTIVE CAP LAYER GROWTH

FIELD OF THE INVENTION

This invention relates generally to radiation sensors and, in particular, to methods for fabricating a planar radiation sensor and to radiation sensors fabricated by the method.

BACKGROUND OF THE INVENTION

FIG. 1 illustrates a conventional heterojunction (HJ) photovoltaic (PV) diode 1 that includes a radiation absorbing mercury-cadmium-telluride (HgCdTe) n-type base layer 2. Not shown is an underlying electrically insulating and transparent substrate. A p-type HgCdTe region 3 forms a p-n junction 3a with the base layer 2. In that the photodiode 1 is typically one of a plurality of photodiodes provided as a two-dimensional array, the junction 3a is contained within an upstanding mesa structure that provides electrical isolation between adjacent junctions 3a. A passivation layer 4 is comprised of, by example, a layer of cadmium-telluride (CdTe) and functions to reduce surface electrical noise states. Contact metalization 5 is electrically coupled to the p-type region 3 and provides an interface pad for coupling to an indium bump 6. The indium bump 6 is provided to couple the photodiode 1 to external circuitry, such as a readout amplifier (not shown). The resulting hybrid assembly is further packaged, as required, for an intended application.

In operation, infrared (IR) radiation is incident on a bottom surface, or backside, of the photodiode 1. Radiation is absorbed within the base layer 2 and generates photocarriers. When suitably biased, minority photocarriers are collected at the p-n junction 3a and the resulting current is detected.

A conventional fabrication process for manufacturing the photodiode 1 uses deep trench etching (3–5 micrometers) to delineate the detector photodiode mesas. In that this etch is isotropic, lateral etching occurs at approximately the same rate as vertical etching. As a result, the mesa structure is tapered, with the top surface area being smaller than the bottom surface area. However, all subsequent processing for forming the contact metal and the indium bump must be accomplished on the relatively small top surface of the mesa. One disadvantage of providing a small indium bump interconnect is that the reliability of the subsequently formed hybrid assembly may be compromised.

At present, the minimum detector unit cell size is limited by the smallest indium bump size that can be placed on the top surface of the mesa. As can be appreciated, the fabrication of photodetectors having a small unit cell size is desirable in that denser arrays of photodetectors can be provided.

It is also known in the art to fabricate photodiodes by other than the mesa-etch technique described above.

For example, in U.S. Pat. No. 4,105,478 E. S. Johnson discloses the thermally driven diffusion of lithium into a p-type or an n-type HgCdTe body so as to form a p-n junction. However, the diffusion of dopants into a layer of semiconductor material forms a homojunction, which is more susceptible to leakage currents than is a heterojunction.

In U.S. Pat. No. 4,206,003 T. Koehler describes the implantation of an acceptor impurity, such as gold, phosphorus, antimony, or arsenic, into an n-type HgCdTe body to form a p-n junction. The implant is followed by a thermal anneal. In an article entitled "Development of HgCdTe LWIR Heterojunction Mosaics" (Proc. IRIS Detector, 1986, Vol. II, pages 251-260) C. C. Wang et al. describe a p-on-n LWIR detector that includes an undoped HgCdTe active layer having a p-type doped cap layer grown thereon. The structure is subsequently thermally annealed to convert the active layer to n-type, achieving a p-on-n structure. Instead of etching mesas, diodes are delineated by ion implantation to form lateral p-n junctions having short wavelength response. After implantation, passivation is applied.

However, in that both of these last-mentioned processes employ ion implantation, some damage to the semiconductor crystal structure occurs. This damage is a source of noise and leakage currents.

It is one object of this invention to provide a processing technique that enables a photodetector unit cell size to be made smaller than the unit cell size presently obtainable with the mesa-etch technique.

Another object of the invention is to provide a method for fabricating a planar photodetector that does not require either a thermal diffusion or an ion implantation of acceptor or donor species.

It is also an object of the invention to provide a processing technique that enables the size of the indium bump to be made significantly larger than the active area of an underlying photodetector, thereby increasing the contact area and the overall reliability of a hybrid assembly incorporating the photodetector.

A still further object of the invention is to provide an array of infrared radiation responsive heterojunction photodiodes having a substantially planar top surface to facilitate subsequent processing steps, such as the formation of indium bump interconnects.

SUMMARY OF THE INVENTION

The foregoing and other problems are overcome and the objects of the invention are realized by a fabrication process, and a photodiode fabricated by the process, that employs a mask during the deposition of p-type material over n-type base material. The p-type material and the n-type material are each comprised of elements selected from Group IIB-VIA of the periodic table of the elements. A p-n junction is formed through an opening in the mask. Excess p-type material deposited on top of the mask is removed by an etching process. Significantly, depth control of the etching process is not necessary because the etch stops when the mask layer is reached.

This process yields a p-on-n double layer heterojunction (DLHJ) HgCdTe photodiode with performance comparable to a conventional mesa isolated photodiode process. One advantage of this fabrication technique is that the topside surface of the detector array, after processing, is flat (planar) to within less than a micrometer. The planar surface allows higher resolution processing in subsequent processing steps and allows a larger indium bump to be employed, resulting in smaller detector unit cell sizes and in improved hybrid assembly reliability.

Furthermore, thermal diffusion and/or ion implantation of acceptor or donor species is not required to fabricate or delineate the detector unit cells.

A planar photodiode fabricated in accordance with the method of the invention includes a substrate and a semiconductor base region overlying the substrate. The base region is comprised of elements selected from Group IIB-VIA and has a first type of electrical conductivity. A semiconductor layer overlies the base region and is also comprised of elements selected from Group IIB-VIA. The semiconductor layer has a wider bandgap than a bandgap of the base region and functions as a layer of passivation. A dielectric layer at least partially overlies the semiconductor layer. During fabrication of the photodiode this dielectric layer functions as an etch stop during a removal of excess cap material, the remaining cap material forming a cap region within an opening that is etched through the dielectric layer and the semiconductor layer. A bottom surface of the cap region is in electrical contact with the base region. The cap region is also comprised of elements selected from Group IIB-VIA, has a second type of electrical conductivity, and forms a heterojunction with the base region. An electrically conductive contact pad is formed upon a top surface of the cap region. The photodiode further includes an electrically conductive interconnect, preferably an indium bump, that is formed upon the contact pad. The indium bump has a lower surface area that is greater than an area of the top surface of the cap region such that a portion of the lower surf ace of the interconnect overlies a portion of an upper surface of the dielectric layer.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF THE INVENTION

Figure 1:
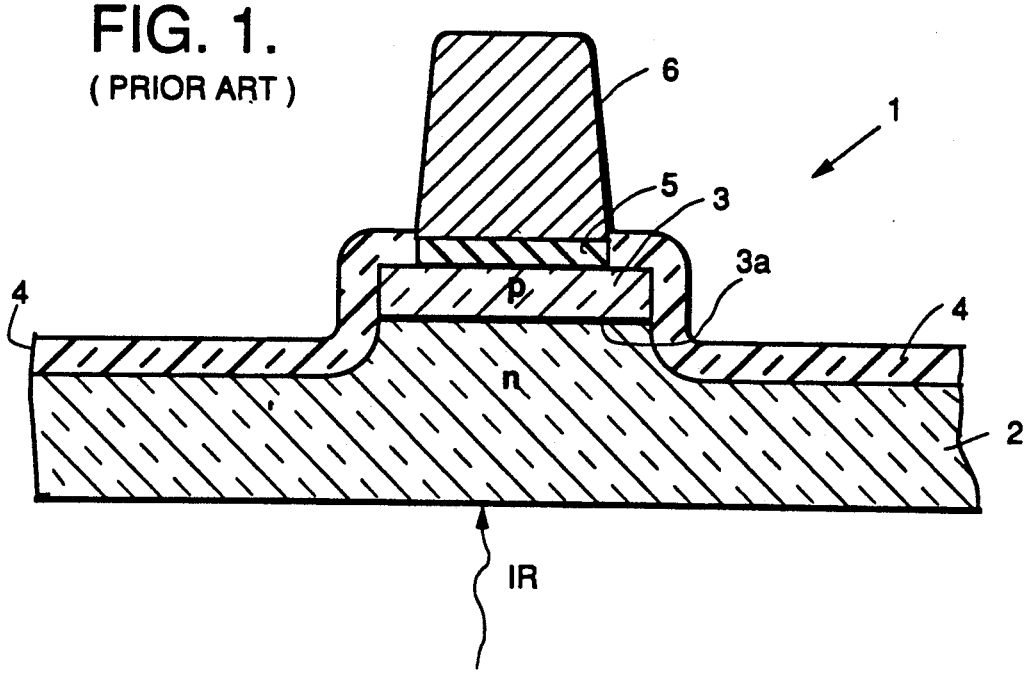
FIG. 1 is a cross-sectional view, not to scale, of a conventional mesa-type photodiode.
Figure 2:
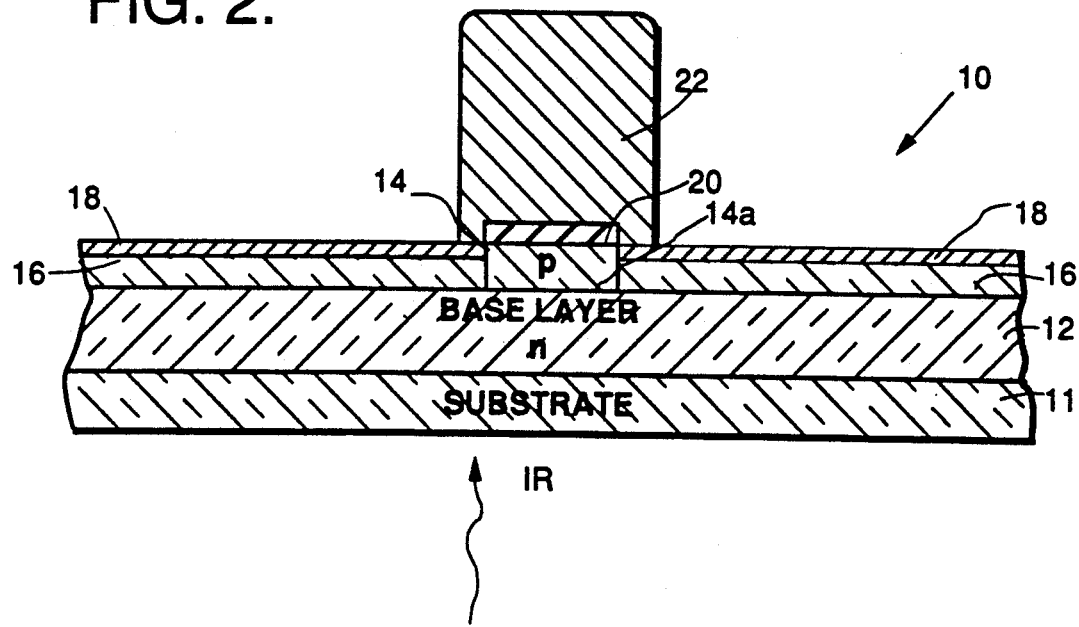
FIG. 2 is a cross-sectional view, not to scale, of a planar photodiode that is constructed in accordance with the invention.
Figure 3:
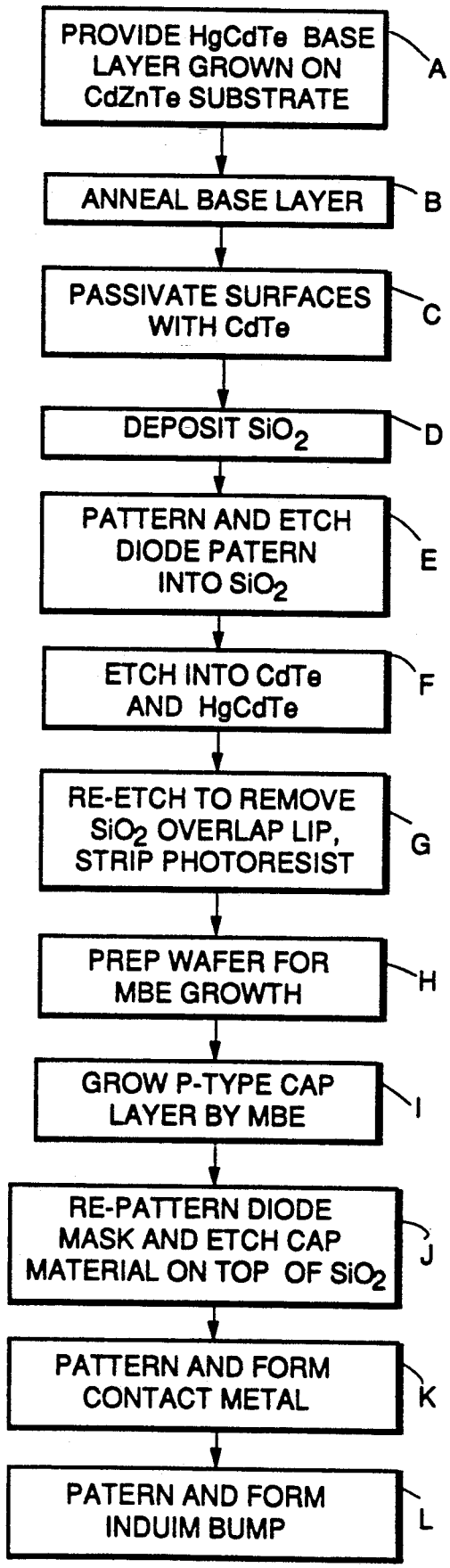
FIG. 3 is a process flow diagram illustrating a presently preferred planar photodiode fabrication method of the invention.

Reference is made to the process flow diagram of FIG. 3, in conjunction with the various cross-sectional views of FIGS. 4a–4g, and the cross-sectional view of FIG. 2.

(FIG. 3-Block A, FIG. 4a) Processing begins with an n-type radiation absorbing HgCdTe base layer 12 that is grown on an electrically insulating and transparent, at the wavelengths of interest, substrate 11. A preferred method for growing the base layer is by Liquid Phase Epitaxy (LPE), and Indium is one suitable n-type dopant. One suitable semiconductor material for the substrate 11 is cadmium-zinc-telluride (CdZnTe). The bandgap of the base layer 12 is selected for absorbing radiation having wavelengths of interest and is set, in a known fashion, by varying the relative concentrations of the Hg and Cd material in accordance with the formula: $Hg_{1-x}Cd_xTe$, wherein (x) is a non-zero number that is less than one.

(FIG. 3-Block B) The structure formed thus far is thermally annealed with an Hg overpressure to remove Hg vacancies in the base layer 12.

(FIG. 3-Block C) The exposed surface of the base layer 12 is passivated with a wide bandgap Group IIB-VIA material, such as CdTe, through a thermal evaporation technique. Other suitable techniques for forming the passivation layer include Chemical Vapor Deposition (CVD), Metal Organic Chemical Vapor Deposition (MOCVD), and sputtering. The result is the formation of a passivation layer 16 having a thickness of approximately 1.5 micrometers.

(FIG. 3-Block D, FIG. 4b) A 1500 Angstrom thick layer 18 of a dielectric, preferably $SiO_2$, is deposited through a CVD technique. $SiO_2$ is a presently preferred dielectric material because of its etch properties, as will be made apparent below.

(FIG. 3-Block E, FIG. 4c) The $SiO_2$ layer 18 is patterned, masked, and etched to form an opening 18a. The opening 18a has dimensions equal to the size of a desired photodetector junction area. This step employs photolithography to form a patterned mask 17, in conjunction with a Buffered Oxide Etch (BOE) that uses buffered HF as an etchant.

Figure 4A:
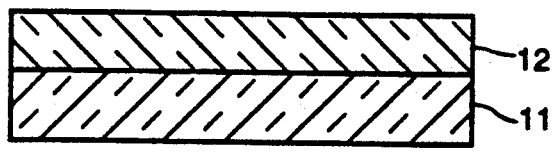
FIGS. 4a–4g are each a cross-sectional view, not to scale, showing various steps of fabricating the planar photodiode in accordance with the method depicted in FIG. 3.
Figure 4B:
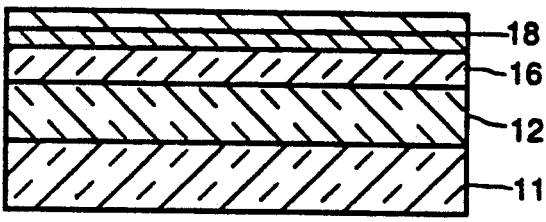
Figure 4C:
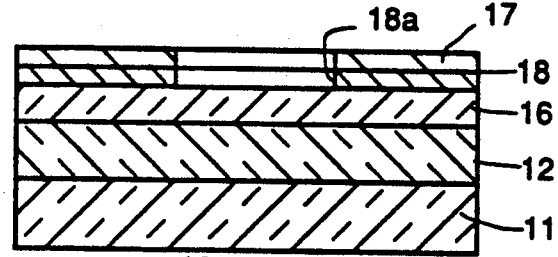
Figure 4D:
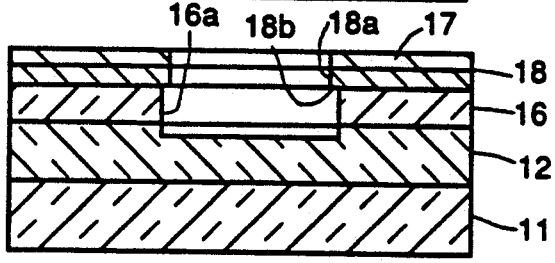
Figure 4E:
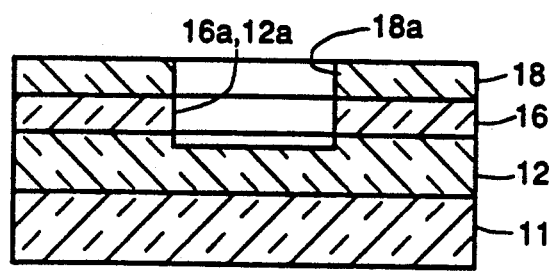
Figure 4F:
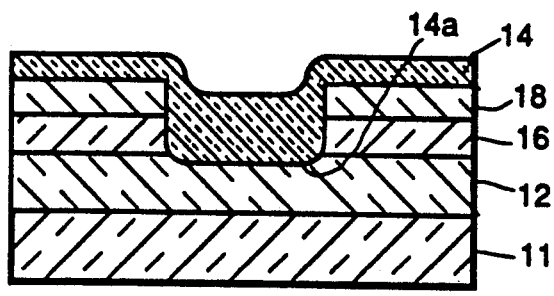
Figure 4G:
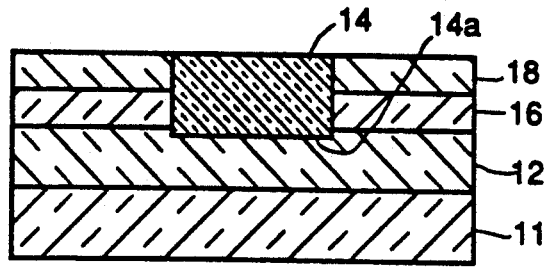

(FIG. 3-Block F, FIG. 4d) A spray etch with Bromine in ethylene glycol (Br/EG) is performed. This step etches completely through the exposed CdTe passivation layer 16, a depth of approximately 1.5 micrometers. Preferably, the etch is stopped at the surface of HgCdTe base layer 12, although some etching of the HgCdTe base layer 12 may occur as shown in FIG. 4d. The result of this etch is the formation of an opening 18a through the passivation layer 18, and possibly also partially into the base layer 16. This etching step also typically results in the formation of an overhanging ledge or lip 18b of $SiO_2$ where the BR/EG etch undercuts the layer 18. The $SiO_2$ dielectric layer 18 is resistant to the BR/EG etchant and remains substantially unaffected.

(FIG. 3-Block G, FIG. 4e) If required, a further BOE is performed to remove the $SiO_2$ lip 18a. The photoresist mask 17 is then stripped.

(FIG. 3-Block H) The structure is next prepared for a vapor phase deposition of a p-type HgCdTe cap material. Molecular Bean Epitaxy (MBE); or alternately MOCVD, are two suitable vapor phase processes for growing the p-type HgCdTe cap layer. For MBE, a suitable preparation step includes an ozone ash for 20 minutes, to remove organic contaminates, followed by a weak (1/16%) Br/EG spray to remove any residual oxides.

(FIG. 3-Block 1, FIG. 4f) A p-type HgCdTe cap layer 14 is grown with, by example, MBE to a thickness of approximately 1.5 micrometers. As a result, the previously formed opening 18a within the $SiO_2$ layer 18 and the opening 16a within the CdTe passivation layer 16 is filled with p-type HgCdTe material. Arsenic is one suitable p-type dopant. Hg-vacancies may also be employed to make the HgCdTe cap layer 14 p-type. The p-type cap layer 14 contacts the n-type base layer 12, forming a p-n heterojunction 14a.

(FIG. 3-Block J, FIG. 4g) The previously employed diode delineation mask is employed in a flip-field configuration to re-pattern the top surface with photoresist. As a result, a protective photoresist mask is positioned over the p-type cap layer 14 in registration with the underlying photodiode unit cell site. A spray etch with Br/EG is accomplished to remove the exposed (non-masked) cap layer material on top of the $SiO_2$ layer 18.

In accordance with an aspect of the invention, the SiO$_2$ layer 18 functions as an etch stop. As a result, after the Br/EG etch, and after the mask is removed, the structure appears as in FIG. 4g having the previously etched openings 18a and 16a filled with p-type HgCdTe material 14.

(FIG. 3-Blocks K and L, FIG. 2) Processing is continued to complete the fabrication of each photodiode 10 of a linear array or a two-dimensional array of photodiodes. This occurs by providing a contact metal mask pattern, thermally depositing contact metal to form a contact 20, and lifting off the contact metal mask. A suitable contact metal system includes a thin layer of gold (approximately 5000 Angstroms) having nickel deposited thereon. Next, an indium bump mask is provided, indium is deposited by thermal evaporation, and the indium bump mask is lifted off. A typical height of the indium bump interconnect 22 is approximately 10 micrometers to approximately 12 micrometers.

As can be seen in FIG. 2, the indium bump 22 may be made significantly larger than the underlying contact 20, with the dimensions of the indium bump being substantially independent of the dimensions of the underlying photodetector 10 unit cell size and/or p-n junction 14a area. Alternately, it can be seen that the dimensions of the photodetector unit cell may be determined without regard for the dimensions of the indium bump 22. Also, although the contact 20 is seen to be substantially the same size as the underlying p-type cap layer 14, it should be realized that a mask may be employed that forms the contact 20 to be larger in area than the underlying p-type cap layer 14. As a result, the area of the photodiode 10 unit cell and/or p-n junction, the metal contact 20, and the size of the indium bump interconnect 22 may each be separately determined and optimized for a desired result. By example, the photodiode unit cell area may be made small, to increase the density and imaging resolution of the array, while increasing the size of the indium bump interconnect 22 so as to improve reliability of the hybrid assembly.

It can also be seen that a portion of the SiO$_2$ layer 18 underlies the indium bump interconnect 22 and electrically isolates same from the underlying passivation layer 18. If desired, a further BOE may be accomplished to remove the exposed portions of SiO$_2$ layer 18, although this step is unnecessary.

The stop etch diode delineation method described above is more repeatable and precise than the currently employed mesa etch delineation technique. This improves the photodiode figure of merit; that is, the dynamic resistance at zero bias times the area ($R_OA$) uniformity over large arrays. As the $R_OA$ is increased a better electrical interface to external amplifier circuitry is achieved. Also, the method of forming the p-n junction does not require a thermal diffusion and/or an ion implantation of dopant species into the base layer 16, as is required by many conventional planar photodiode fabrication approaches, thereby further increasing $R_OA$ uniformity over the array.

Furthermore, in that the various edges and surfaces of the mesa structure are eliminated, the detector structures fabricated in accordance with the method of the invention also exhibit reduced retro-reflection characteristics.

The planar process of the invention also increases processing resolution, enabling the detector unit cell size to be made significantly smaller than is obtainable with conventional processing techniques.

It should be realized that although the invention has been described in the context of specific materials, specific dimensions, and specific processing parameters, such as etchants and deposition techniques, a number of modifications to these various materials, dimensions, and processing parameters may be made, while still obtaining the same result. For example, the teaching of the invention is also applicable to n-on-p devices. Also by example, in FIG. 3-Block D SiN$_4$ may be employed, instead of SiO$_2$, in conjunction with a subsequently performed Reactive Ion Etch. Also, in FIG. 3-Block F a Reactive Ion Etch may be used instead of the BR/EG spray etch. As a result, the step of FIG. 3-Block G may be eliminated.

Thus, while the invention has been particularly shown and described with respect to a preferred embodiment thereof, it will be understood by those skilled in the art that changes in form and details may be made therein without departing from the scope and spirit of the invention.

What is claimed is:

1. A method of fabricating a photovoltaic diode, comprising the steps of:
   providing a base layer of semiconductor material comprised of elements selected from Group IIB-VIA and having a first type of electrical conductivity;
   forming a passivation layer comprised of elements selected from Group IIB-VIA over a surface of the base layer;
   forming a layer comprised of a dielectric material over the passivation layer;
   forming an opening through the layer of dielectric material and through the passivation layer so as to expose the base layer;
   depositing a cap layer of semiconductor material comprised of elements selected from Group IIB-VIA and having a second type of electrical conductivity, the semiconductor material of the cap layer substantially filling the opening;
   forming a mask over the cap layer in registration with the filled opening;
   etching away exposed portions of the cap layer, the etchant being selected in accordance with the material composition of the dielectric layer such that the dielectric layer functions as an etch stop;
   removing the mask; and
   forming an electrical connection to the remaining semiconductor material of the cap layer that fills the opening.

2. A method as set forth in claim 1 wherein the step of providing a base layer of semiconductor material having a first type of electrical conductivity includes a step of growing a layer of n-type HgCdTe upon a substrate by a Liquid Phase Epitaxy process.

3. A method as set forth in claim 1 wherein the step of forming a passivation layer over a surface of the base layer includes a step of forming a layer of semiconductor material having a wider bandgap than a bandgap of the semiconductor material of the base layer.

4. A method as set forth in claim 1 wherein the step of forming a passivation layer over a surface of the base layer includes a step of thermally evaporating a layer comprised of CdTe.

5. A method as set forth in claim 1 wherein the step of forming a layer comprised of a dielectric material over the passivation layer includes a step of depositing a layer comprised of SiO$_2$ or Si$_3$N$_4$.

6. A method as set forth in claim 1 wherein the step of forming an opening through the layer of dielectric material and through the passivation layer includes a first step of selectively etching the dielectric material with a Buffered Oxide Etch, and a step of selectively etching the passivation layer with Bromine/ethylene glycol.

7. A method as set forth in claim 6 wherein the step of selectively etching the passivation layer with Bromine/ethylene glycol undercuts the dielectric layer, leaving an overhanging portion extending into the opening, and further including a step of removing the overhanging portion of the dielectric material with a further step of etching away the overhanging portion of the dielectric material with a Buffered Oxide Etch.

8. A method as set forth on claim 2 wherein the step of depositing a cap layer of semiconductor material having a second type of electrical conductivity includes a step of depositing a layer of p-type HgCdTe with a vapor phase epitaxy process.

9. A method as set forth in claim 1 wherein the step of forming a layer comprised of a dielectric material over the passivation layer includes a step of depositing a layer of $SiO_2$, and wherein the step of etching away exposed portions of the cap layer includes a step of selectively etching exposed portions of the cap layer with an etchant solution that includes Br/ethylene glycol, the $SiO_2$ dielectric layer functioning as an etch stop so as to prevent etching the underlying passivation layer.

10. A method as set forth in claim 1 wherein the step of forming an electrical connection to the semiconductor material of the cap layer includes a step of forming a layer of contact metalization upon the cap layer material within the filled opening; and a step of forming an indium bump interconnect in electrical contact with the contact metalization.

11. A method as set forth in claim 10 wherein the step of forming an indium bump interconnect in electrical contact with the contact metalization forms the indium bump interconnect with a lower surface that overlies the layer of contact metalization, the indium bump interconnect being formed such that an area of the lower surface is larger than a top surface area of the filled opening.

12. A method as set forth in claim 1 wherein, prior to the step of forming an electrical connection to the remaining semiconductor material of the cap layer, a top surface of the dielectric layer is planar to within approximately one micrometer.

* * * * *